United States Patent
Belady et al.

(10) Patent No.: US 7,578,733 B2
(45) Date of Patent: Aug. 25, 2009

(54) ENCLOSURES WITH REDUNDANT FANS IN DOORS WITH INTERLOCKS

(75) Inventors: Christian L. Belady, McKinney, TX (US); Eric C. Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 908 days.

(21) Appl. No.: 10/900,862

(22) Filed: Jul. 27, 2004

(65) Prior Publication Data

US 2006/0025065 A1 Feb. 2, 2006

(51) Int. Cl.
*H05K 5/00* (2006.01)
*H05K 7/20* (2006.01)
*G06F 1/20* (2006.01)

(52) U.S. Cl. .................. 454/184; 361/687; 361/695; 361/724; 361/726

(58) Field of Classification Search .................. 454/184, 454/195; 361/687, 695, 724, 726
See application file for complete search history.

(56) References Cited

U.S. PATENT DOCUMENTS

| | | | | |
|---|---|---|---|---|
| 3,221,632 A | * | 12/1965 | Copp | .......................... 454/188 |
| 4,375,735 A | * | 3/1983 | Rhoads | .......................... 49/68 |
| 4,433,985 A | * | 2/1984 | McGee | .......................... 96/111 |
| 5,475,562 A | * | 12/1995 | Gow | .......................... 361/695 |
| 5,877,938 A | * | 3/1999 | Hobbs et al. | ................. 361/724 |
| 5,996,361 A | * | 12/1999 | Bessler et al. | ................. 62/163 |
| 6,164,369 A | * | 12/2000 | Stoller | ................... 165/104.33 |
| 6,462,944 B1 | * | 10/2002 | Lin | .......................... 361/687 |

* cited by examiner

*Primary Examiner*—Steven B McAllister
*Assistant Examiner*—Patrick F. O'Reilly, III

(57) ABSTRACT

An equipment rack including front and back doors is configured with fans for air cooling enclosed electronic devices in both doors. The fans in each door are sufficient, by themselves, to provide sufficient airflow to cool the electronic devices. The two doors include switches and magnetic interlocks configured such that when one door is opened, the magnetic interlock on the other door is activated preventing both doors from being opened at the same time. This ensures that at least one door is always closed while the system is powered up, and since the fans in each door provide sufficient cooling for the equipment rack, the rack is always sufficiently cooled to prevent electronic device failure from overheating.

14 Claims, 3 Drawing Sheets

ENCLOSURES WITH REDUNDANT FANS IN DOORS WITH INTERLOCKS

FIELD OF THE INVENTION

The present invention relates generally to the field of enclosures, and more particularly to the field of enclosures including cooling fans and front and back doors.

BACKGROUND OF THE INVENTION

As electronic devices increase in speed and power consumption, cooling these devices becomes critical to their proper operation. Particularly when placed inside enclosures, which may modify the natural airflow around the device, proper cooling device operation is critical. Many enclosures include fans on either a front door or a back door to force air through the enclosure (since the sides are often solid) cooling the enclosed electronic devices. However, it is sometimes necessary to open either the front door or the back door of the enclosure while the electronic devices within the rack are operating. In this case, if the fans are mounted on the door that is opened, the airflow over the electronic devices may be disrupted while the door is open, and the devices may overheat to the point of failure. In some enclosures, fans are included in both the front and back doors to allow one door to be open while the fans in the other door are sufficient to provide proper airflow over the electronic devices in the enclosure. However, if both doors are opened at the same time, the fans in the front and back doors are no longer providing airflow, and the electronic devices may overheat to the point of failure.

SUMMARY OF THE INVENTION

An enclosure including front and back doors is configured with fans for air cooling enclosed electronic devices in both doors. The fans in each door are sufficient, by themselves, to provide sufficient airflow to cool the electronic devices. The two doors include switches and magnetic interlocks configured such that when one door is opened, the magnetic interlock on the other door is activated preventing both doors from being opened at the same time. This ensures that at least one door is always closed while the system is powered up, and since the fans in each door provide sufficient cooling for the enclosure, the enclosure is always sufficiently cooled to prevent electronic device failure from overheating.

Other aspects and advantages of the present invention will become apparent from the following detailed description, taken in conjunction with the accompanying drawings, illustrating by way of example the principles of the invention.

DETAILED DESCRIPTION

Figure 1:
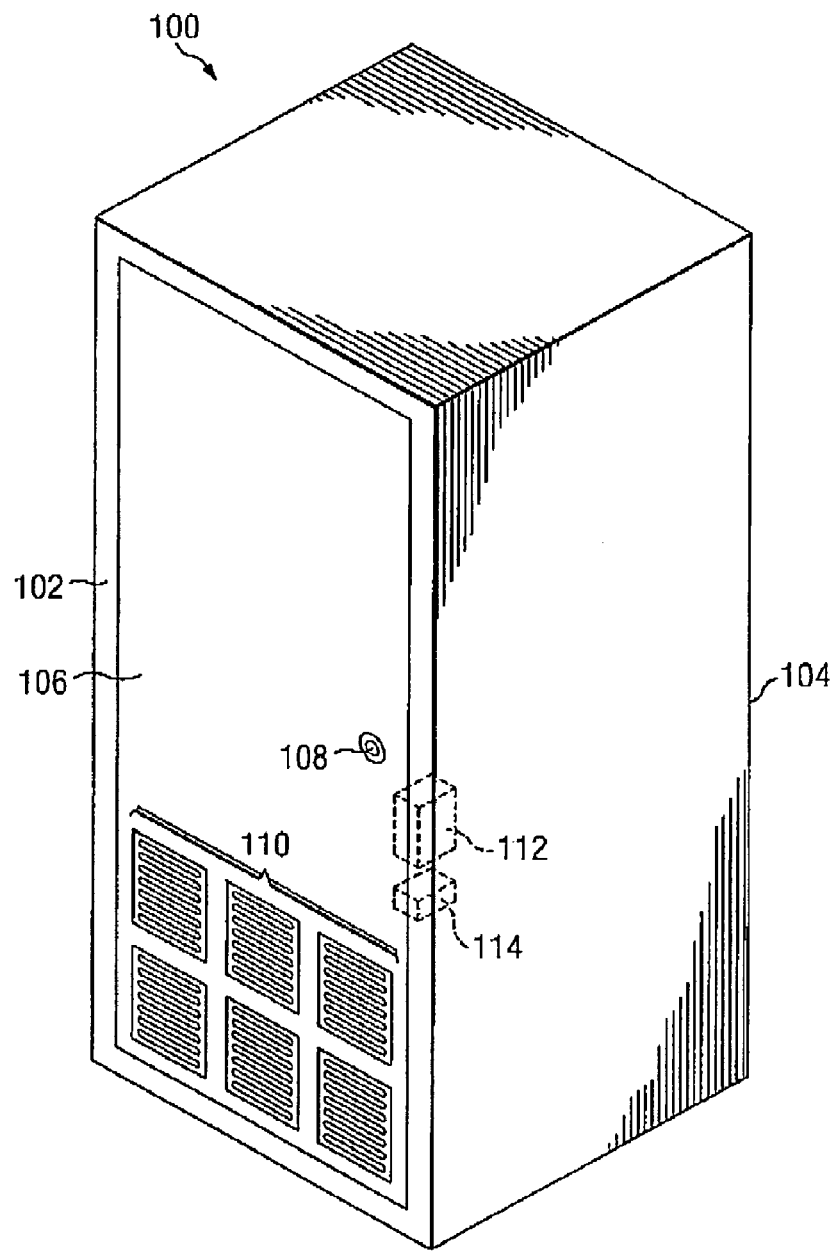
FIG. 1 is a view of an enclosure including a front door according to the present invention.

FIG. 1 is a view of an enclosure including a front door according to the present invention. The example embodiment of the present invention shown in FIG. 1 is an enclosure 100 including a front 102 and a back 104. The front 102 of the enclosure 100 includes a front door 106. The front door 106 includes a lock 108, at least one fan 110, a switch 114 configured to close when the front door 106 is opened, and a latch 112. This latch 112 is configured to activate and prevent opening of the front door 106 when the power to the enclosure 100 is on, and the back door 200 is open. Those of skill in the art will recognize that there are many different ways of implementing the latch 112 within the scope of the present invention. For example, any of the variety of magnetic latches may be used, mechanical latches activated by a solenoid, or simple solenoid latches may be used within the scope of the present invention.

Figure 2:
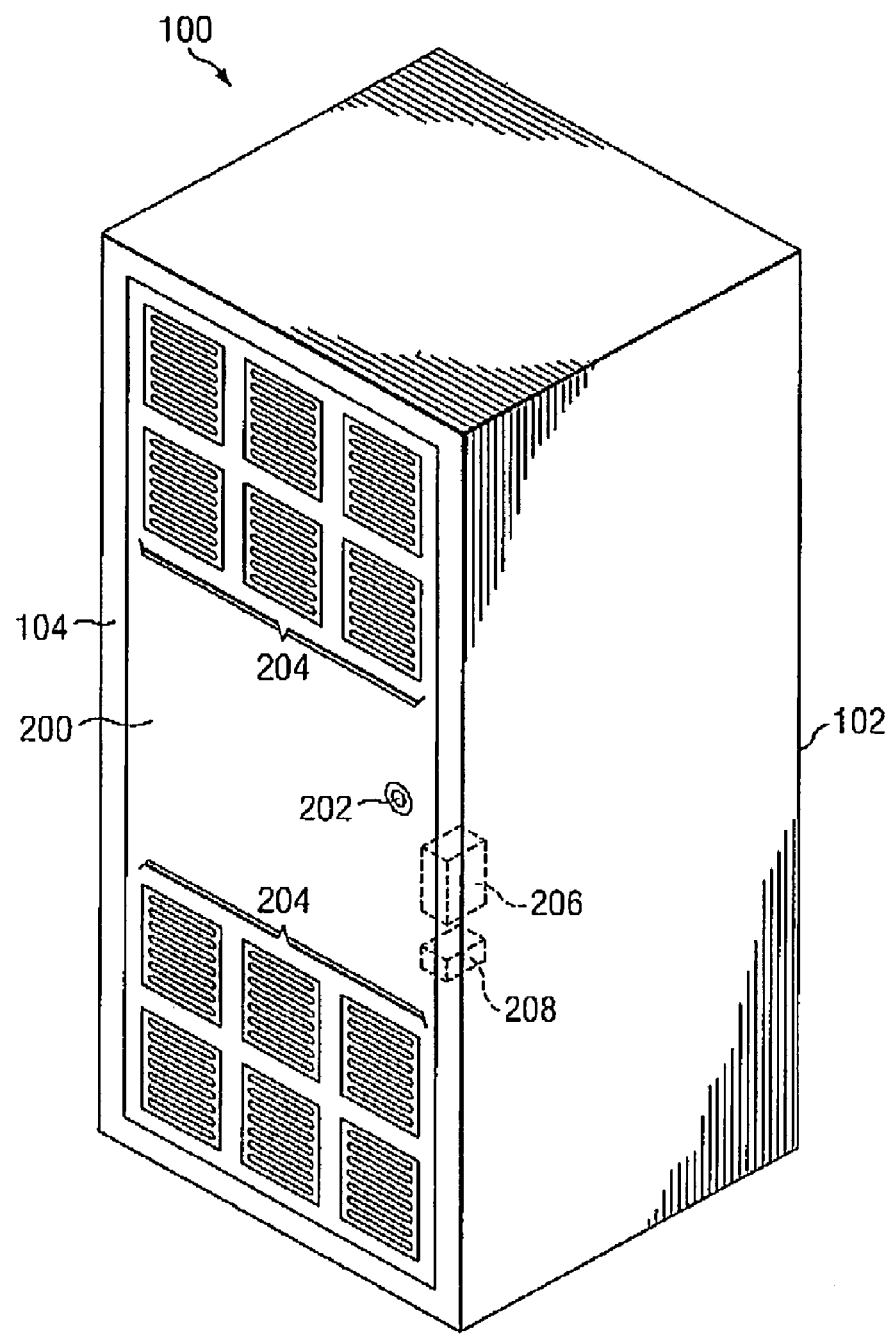
FIG. 2 is a view of an enclosure including a back door according to the present invention.

FIG. 2 is a view of an enclosure including a back door according to the present invention. FIG. 2 is a view of the back of the enclosure from FIG. 1. The example embodiment of the present invention shown in FIG. 2 is an enclosure 100 including a front 102 and a back 104. The back 104 of the enclosure 100 includes a back door 200. The back door 200 includes a lock 202, at least one fan 204, a switch 208 configured to close when the back door 200 is opened, and a latch 206. This latch 206 is configured to activate and prevent opening of the back door 200 when the power to the enclosure 100 is on, and the front door 106 is open. Those of skill in the art will recognize that there are many different ways of implementing the latch 206 within the scope of the present invention. For example, any of the variety of magnetic latches may be used, mechanical latches activated by a solenoid, or simple solenoid latches may be used within the scope of the present invention.

Figure 3:
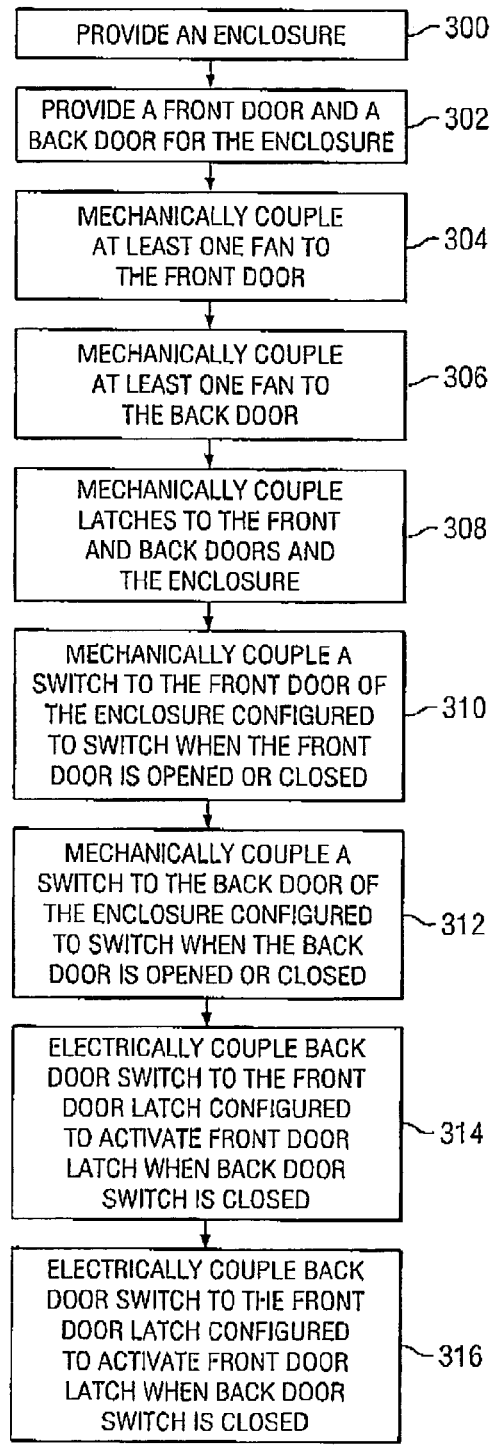
FIG. 3 is a flow chart of a method for constructing an enclosure with redundant fans in doors with interlocks according to the present invention.

FIG. 3 is a flow chart of a method for constructing an enclosure with redundant fans in doors with interlocks according to the present invention. In a step 300, an enclosure having a front and a back is provided. In a step 302, a front door and a back door for the enclosure is provided. In a step 304, at least one fan is mechanically coupled to the front door. In a step 306, at least one fan is mechanically coupled to the back door. In a step 308, latches are mechanically coupled to the front and back doors and the enclosure. In a step 310, a switch configured to switch when the front door is opened or closed is mechanically coupled to the front door or the enclosure or both. In a step 312, a switch configured to switch when the back door is opened or closed is mechanically coupled to the back door or the enclosure or both. Those of skill in the art will recognize that these switches may be normally open when the door is closed, or in an alternative embodiment may be normally closed when the door is closed. Which type of switch is used will depend on the type of latch used. Some latches operate to lock the door when power is applied to them, and default to unlock the door when the power is interrupted. Other latches operate to allow the door to open when power is applied to them, and default to locking the door when power is interrupted. Thus, either type of latch and either type of switch may be used within the scope of the present invention, and it is simply a design decision about which to use. In a step 314, the back door switch is electrically coupled to the front door latch in a configuration that activates the front door latch when the back door switch is closed. In a step 316, the front door switch is electrically coupled to the back door latch in a configuration that activates the back door latch when the front door switch is closed.

Figure 4:
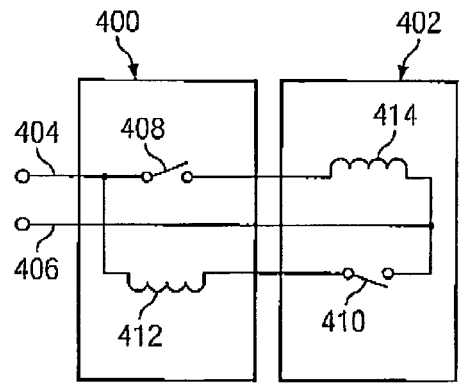
FIG. 4 is a simplified schematic diagram of a system of switches and interlocks for use in an enclosure according to the present invention.

FIG. 4 is a simplified schematic diagram of a system of switches and interlocks for use in an enclosure according to the present invention. In the example embodiment of the present invention shown in FIG. 4 the components present in the front door 400 and the back door 402 are shown. The front door 400 of the enclosure includes a front door switch 408. In some embodiments of the present invention this front door switch 408 is configured to open when the front door 400 is closed, and to close when the front door 400 is open, while in other embodiments of the present invention this front door switch 408 is configured to close when the front door 400 is closed, and to open when the front door 400 is open. The back door 402 of the enclosure includes a back door switch 410. In some embodiments of the present invention this back door switch 410 is configured to open when the back door 402 is closed, and to close when the back door 402 is open, while in other embodiments of the present invention this back door switch 410 is configured to close when the back door 402 is closed, and to open when the back door 402 is open. Which switch configuration is used is dependent on the type of latches used on the doors. The front door 400 also includes a magnetic latch 412 connected in series with the back door switch 410, and configured to activate and prevent the front door 400 from being opened when the back door switch 410 is closed. The back door 402 also includes a magnetic latch 414 connected in series with the front door switch 408, and configured to activate and prevent the back door 402 from being opened when the front door switch 408 is closed. In some embodiments of the present invention, these latches may be configured to lock the doors when power is applied to them, while in other embodiments of the present invention, these latches may be configured to unlock the doors when power is applied to them. These series circuits are powered by a power supply between nodes 404 and 406. This power supply may be the enclosure power supply and configured to always be activated whenever any electronic device within the enclosure is powered up. Other example embodiments of the present invention may use a different power supply for this circuit within the scope of the present invention.

Figure 5:
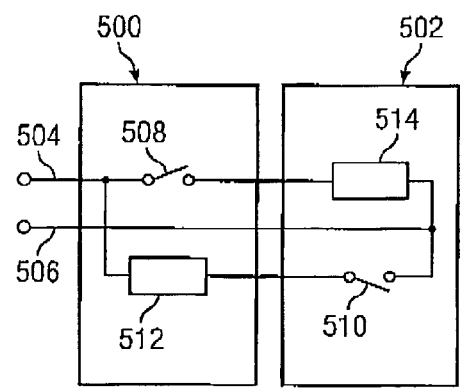
FIG. 5 is a simplified schematic diagram of a system of switches and interlocks for use in an enclosure according to the present invention.

FIG. 5 is a simplified schematic diagram of a system of switches and interlocks for use in an enclosure according to the present invention. In the example embodiment of the present invention shown in FIG. 5 the components present in the front door 500 and the back door 502 are shown. The front door 500 of the enclosure includes a front door switch 508. In some embodiments of the present invention, this front door switch 508 is configured to open when the front door 500 is closed, and to close when the front door 500 is open, while in other embodiments of the present invention, the front door switch 508 is configured to close when the front door 500 is closed, and to open when the front door 500 is opened. The back door 502 of the enclosure includes a back door switch 510. In some embodiments of the present invention, this back door switch 510 is configured to open when the back door 502 is closed, and to close when the back door 502 is open, while in other embodiments of the present invention, the back door switch 510 is configured to close when the back door 502 is closed, and to open when the back door 502 is open. Which switch configuration is used is dependent on the type of latches used on the doors. The front door 500 also includes a latch 512 connected in series with the back door switch 510, and configured to activate and prevent the front door 500 from being opened when the back door switch 510 is closed. The back door 502 also includes a latch 514 connected in series with the front door switch 508, and configured to activate and prevent the back door 502 from being opened when the front door switch 508 is closed. In some embodiments of the present invention, these latches may be configured to lock the doors when power is applied to them, while in other embodiments of the present invention, these latches may be configured to unlock the doors when power is applied to them. These series circuits are powered by a power supply between nodes 504 and 506. This power supply may be the enclosure power supply and configured to always be activated whenever any electronic device within the enclosure is powered up. Other example embodiments of the present invention may use a different power supply for this circuit within the scope of the present invention. Those of skill in the art will recognize that there are many different ways of implementing the latches 512, and 514 within the scope of the present invention. For example, any of the variety of magnetic latches may be used, mechanical latches activated by a solenoid, or simple solenoid latches may be used within the scope of the present invention.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A device comprising:
an enclosure having a front door and a back door;
at least one front door fan attached to said front door;
at least one back door fan attached to said back door;
a front switch mechanically coupled with said front door, configured to close when said front door is opened;
a back switch mechanically coupled with said back door, configured to close when said back door is opened;
a back door latch, configured to activate, locking said back door, when said front switch is closed, wherein said back door latch is a magnetic latch; and
a front door latch, configured to activate, locking said front door, when said back switch is closed, wherein said front door latch is a magnetic latch.

2. A device as recited in claim 1,
wherein said front switch is also mechanically coupled with said enclosure; and
wherein said back switch is also mechanically coupled with said enclosure.

3. A device as recited in claim 1, further comprising:
a power supply configured to activate said front door latch, locking said front door, when said back switch is closed, and to activate said back door latch, locking said back door, when said front switch is closed.

4. A device as recited in claim 3,
wherein said power supply is the enclosure power supply.

5. A device comprising:
an enclosure having a front door and a back door;
at least one front door fan attached to said front door;
at least one back door fan attached to said back door;
a front switch mechanically coupled with said enclosure, configured to close when said front door is opened;
a back switch mechanically coupled with said enclosure, configured to close when said back door is opened;
a back door latch, configured to activate, locking said back door, when said front switch is closed, wherein said back door latch is a magnetic latch; and a front door latch, configured to activate, locking said front door, when said back switch is closed, wherein said front door latch is a magnetic latch.

6. A device as recited in claim 5, further comprising:

a power supply configured to activate said front door latch, locking said front door, when said back switch is closed, and to activate said back door latch, locking said back door, when said front switch is closed.

7. A device as recited in claim 6, wherein said power supply is an enclosure power supply.

8. A method comprising the steps of:

providing an enclosure;

providing a front door and a back door for the enclosure;

attaching at least one front door fan to the front door;

attaching at least one back door fan to the back door;

mechanically coupling a front door latch to the front door, wherein the front door latch is a magnetic latch;

mechanically coupling a back door latch to the back door, wherein the back door latch is a magnetic latch;

mechanically coupling a normally open switch to the front door configured to close when the front door is opened;

mechanically coupling a normally open switch to the back door configured to close when the back door is opened;

electrically coupling the back door switch to the front door latch in a configuration that activates the front door latch, locking the front door, when the back door switch is closed; and electrically coupling the front door switch to the back door latch in a configuration that activates the back door latch, locking the back door, when the front door switch is closed.

9. A method as recited in claim 8, wherein the front door switch is also mechanically coupled to the enclosure, and the back door switch is also mechanically coupled to the enclosure.

10. A method as recited in claim 8, further including the step of:

electrically coupling a power supply to the front and back door switches and the front and back door latches in a configuration that activates the front latch, locking the front door, when the back switch is closed, and activates the back latch, locking the back door, when the front switch is closed.

11. A method as recited in claim 10, wherein the power supply is an enclosure power supply.

12. A method comprising the steps of:

providing an enclosure;

providing a front door and a back door for the enclosure;

attaching at least one front door fan to the front door;

attaching at least one back door fan to the back door;

mechanically coupling a front door latch to the front door, wherein the front door latch is a magnetic latch;

mechanically coupling a back door latch to the back door, wherein the back door latch is a magnetic latch;

mechanically coupling a normally open switch to the enclosure configured to close when the front door is opened;

mechanically coupling a normally open switch to the enclosure configured to close when the back door is opened;

electrically coupling the back door switch to the front door latch in a configuration that activates the front door latch, locking the front door, when the back door switch is closed; and electrically coupling the front door switch to the back door latch in a configuration that activates the back door latch, locking the back door, when the front door switch is closed.

13. A method as recited in claim 12, further including the step of:

electrically coupling a power supply to the front and back door switches and the front and back door latches in a configuration that activates the front latch, locking the front door, when the back switch is closed, and activates the back latch, locking the back door, when the front switch is closed.

14. A method as recited in claim 13, wherein the power supply is an enclosure power supply.

* * * * *